(12) United States Patent
Tang et al.

(10) Patent No.: US 7,262,107 B2
(45) Date of Patent: Aug. 28, 2007

(54) CAPACITOR STRUCTURE FOR A LOGIC PROCESS

(75) Inventors: Stephen H. Tang, Pleasanton, CA (US); Ali Keshavarzi, Portland, OR (US); Dinesh Somasekhar, Portland, OR (US); Fabrice Paillet, Hillsboro, OR (US); Muhammad M. Khellah, Tigard, OR (US); Yibin Ye, Portland, OR (US); Shih-Lien L. Lu, Portland, OR (US); Vivek K. De, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 156 days.

(21) Appl. No.: 11/170,504

(22) Filed: Jun. 29, 2005

(65) Prior Publication Data

US 2007/0004162 A1    Jan. 4, 2007

(51) Int. Cl.
*H01L 21/331*    (2006.01)

(52) U.S. Cl. .......... 438/372; 438/202; 257/297
(58) Field of Classification Search ........... 438/202, 438/203, 238, 372, 532; 257/297, 368, 386, 257/528
See application file for complete search history.

(56) References Cited

U.S. PATENT DOCUMENTS 5,759,882 A * 6/1998 Kao et al. ............... 438/202
6,174,803 B1 * 1/2001 Harvey ..................... 438/638

* cited by examiner

*Primary Examiner*—Phuc T. Dang
(74) *Attorney, Agent, or Firm*—Carrie A. Boone, P.C.

(57) ABSTRACT

A manufacturing process modification is disclosed for producing a metal-insulator-metal (MIM) capacitor. The MIM capacitor may be used in memory cells, such as DRAMs, and may also be integrated into logic processing, such as for microprocessors. The processing used to generate the MIM capacitor is adaptable to current logic processing techniques. Other embodiments are described and claimed.

12 Claims, 8 Drawing Sheets

CAPACITOR STRUCTURE FOR A LOGIC PROCESS

FIELD OF THE INVENTION

This invention relates to DRAM memory cells, and, more particularly, to a method for forming an optimized capacitor to be used in a DRAM.

BACKGROUND OF THE INVENTION

There has been a trend, in recent years, for coupling memory with logic circuits, such as microprocessors. Integrating more on-die memory, such as larger caches, within a microprocessor is a power-efficient means of achieving higher performance from the microprocessor. Increasing memory on a microprocessor may provide a larger performance increase than any other optimization of the microprocessor, for a given power budget. The integration may include static random-access memory (SRAM) or dynamic RAM (DRAM) coupled with the microprocessor logic, on the same semiconductor wafer.

Because of the area consumed by six-transistor SRAM (6T SRAM) cells typically used in larger caches, the size of caches is limited to maintain a reasonable die size and manufacturing cost. Minimizing the additional cost of incorporating a denser memory cell than SRAM is preferred for enabling larger caches. Thus, system designers wanting to integrate memory with logic devices generally choose DRAM, which occupies less space on a semiconductor wafer.

Transistors make up the heart of both microprocessors and memories. The manufacturing of transistors has occurred along two distinct paths, one for microprocessors and other logic circuits (logic processing) and another for memories (memory processing). For logic processing, transistors are optimized to be as fast as possible, and thus follow trends such as using thinner oxides and shorter channels, in order to obtain as much performance out of the transistor as possible. Leakage from these transistors tends to get worse as the logic device get faster (currently, microprocessors are available in the GigaHertz range). Although leakage is undesirable, microprocessor manufacturers can survive with the leaky transistors because the microprocessor has a large power budget.

In contrast, for memory processing, the impetus to avoid leakage from the transistors is vital. For DRAM manufacturers, this means having a good capacitor, so as to maintain as high a retention time as possible. A capacitor is made up of a dielectric material sandwiched between two plates, which are usually made of metal. Dielectric materials are generally selected in reference to a value, k, which denotes the permittivity of the material, relative to a vacuum. Untreated silicon dioxide ($SiO_2$), for example, has a k-value of 4. A material with a high k-value makes a better dielectric for a capacitor than a material with a low k-value, where like metals are used for the plates.

Because of the presence of capacitors in the DRAM, the transistors in the DRAMs may be poor performers, relative to the logic transistors. DRAM transistors, however, do not leak, which is critical to DRAM performance. Thus, the capacitors used in DRAM manufacture are made with additional processing. As the DRAM cell gets smaller and smaller, it becomes more difficult to create a capacitor with enough capacitance, since a larger capacitance per unit area is needed. To optimize the supplemental capacitance, additional processing may be employed. Such additional processing is outside the normal methodology employed during logic processing.

Dynamic RAM (DRAM) cells with one transistor and one capacitor, known as 1T-1C DRAMs, may be ten times smaller in area, as compared to SRAM cells. The manufacture of such 1T-1C DRAMS usually involves costly processing steps to make a capacitor that can store enough charge to maintain reasonable refresh times (typically, at least 25 fF). Recently, interest in DRAM gain cells, specifically two-transistor (2T) and three-transistor (3T) DRAMs, has been growing. While the 2T and 3T DRAMs are larger in area than 1T-1C DRAMs, they are less expensive to manufacture and more scalable to future device technologies, since they do not employ a fixed capacitor value.

One barrier to embedding DRAMs in a logic process is gate leakage. Cutting-edge microprocessors are typically designed with state-of-the-art transistors. Such transistors employ thin oxides to control short channel effects and increase gate capacitance for higher drive current. In present microprocessor designs, the gate oxide of transistors is so thin (three to five molecular layers thick) that a significant amount of gate leakage current flows through the microprocessor. The leakage current of such a transistor in a 2T or 3T DRAM gain cell drastically reduces its retention time.

Additionally, the distinct approaches taken to memory processing and logic processing have made it difficult to integrate memories within logic devices. In particular, the complexity of processing the capacitor within the DRAM has made incorporating DRAMs into logic devices difficult and expensive.

Thus, there is a continuing need to for a capacitor design to be used with a DRAM cell that overcomes the shortcomings of the prior art.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein like reference numerals refer to like parts throughout the various views, unless otherwise specified.

DETAILED DESCRIPTION

In accordance with the embodiments described herein, a manufacturing process modification is disclosed for producing a metal-insulator-metal (MIM) capacitor. The MIM capacitor may be used in memory cells, such as DRAMs, and may also be integrated into logic processing, such as for microprocessors. The processing used to generate the MIM capacitor is adaptable to current logic processing techniques. The MIM capacitor is formed between gates or diffusion and the first metal layer. A side-effect of the capacitor formed in this manner is that a local interconnect layer is created that can be used to link gates and diffusions that are in proximity without utilizing the first metal layer. In some embodiments, the process utilizes one extra deposition, lithography, and etching step.

In the following detailed description, reference is made to the accompanying drawings, which show by way of illustration specific embodiments in which the invention may be practiced. However, it is to be understood that other embodiments will become apparent to those of ordinary skill in the art upon reading this disclosure. The following detailed description is, therefore, not to be construed in a limiting sense, as the scope of the present invention is defined by the claims.

As explained above, recently, a 2T-1C gain cell has been proposed to be used in DRAM. The 2T-1C gain cell utilizes a metal oxide semiconductor (MOS) capacitor to boost the capacitance at the storage node, which enhances the retention time of the cell.

Figure 1:
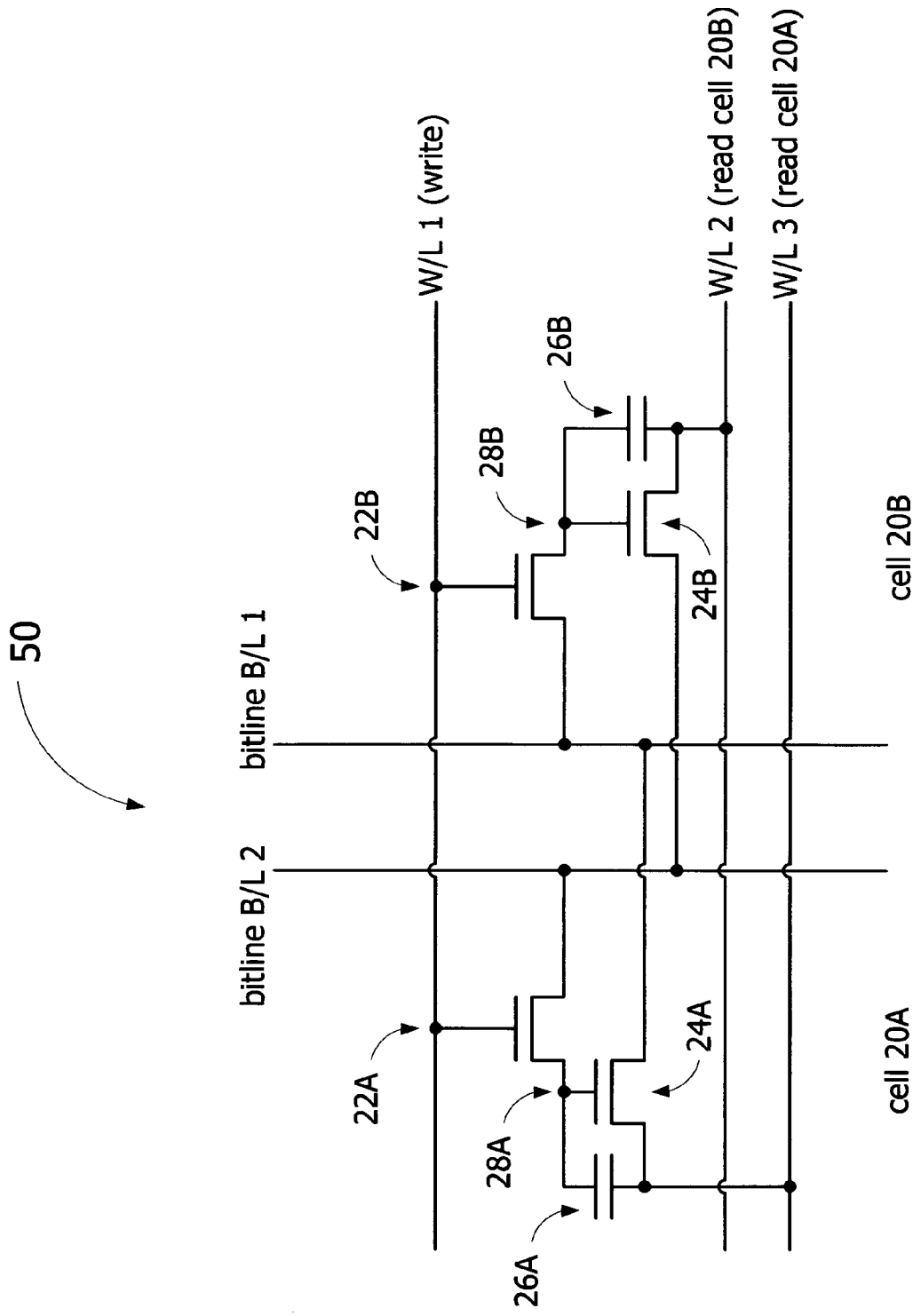
FIG. 1 is a schematic diagram of a pair of 2T-1C gain cells of a DRAM, according to the prior art.

The schematic and operation of the 2T-1C gain cell is depicted in FIG. 1, according to the prior art. A 2T-1C DRAM 50 includes two gain cells 20A and 20B. Gain cell 20A includes write transistor 22A, read transistor 24A, and MOS capacitor 26A; gain cell 20B includes write transistor 22B, read transistor 24B, and MOS capacitor 26B. The cells 20A and 20B share two bit lines B/L 1 and B/L 2 and three word lines, a word line W/L 1 (write), a word line W/L 2 (read), and a word line W/L 3 (read). Storage node 28A is indicated for cell 20A; storage node 28B is indicated for cell 20B.

When the write word line W/L 1 turns on the write transistor 22A (22B), the value on the write bit line is transferred to the storage node 28A (28B) of the gain cell 20A (20B). To read the cell 20A, the read word line W/L 3 is activated and the read transistor 24A transfers a current onto the read bit line B/L 1 that depends on the voltage at the storage node 28A. To read the cell 20B, the read word line W/L 2 is activated and the read transistor 24B transfers a current onto the read bit line B/L 2 that depends on the voltage at the storage node 28B.

Although the transistors of the DRAM 50 include capacitance at their gates, the MOS capacitor 26A (26B) boosts the capacitance at the storage node 28A (28B), to improve the retention time of the cell 20A (20B). The charge on the storage node 28A (28B) leaks away due to subthreshold, junction, and gate leakage. The MOS capacitor 26A (26B) stores extra charge to delay the time when a stored logic "0" and logic "1" become indistinguishable.

Figure 2:
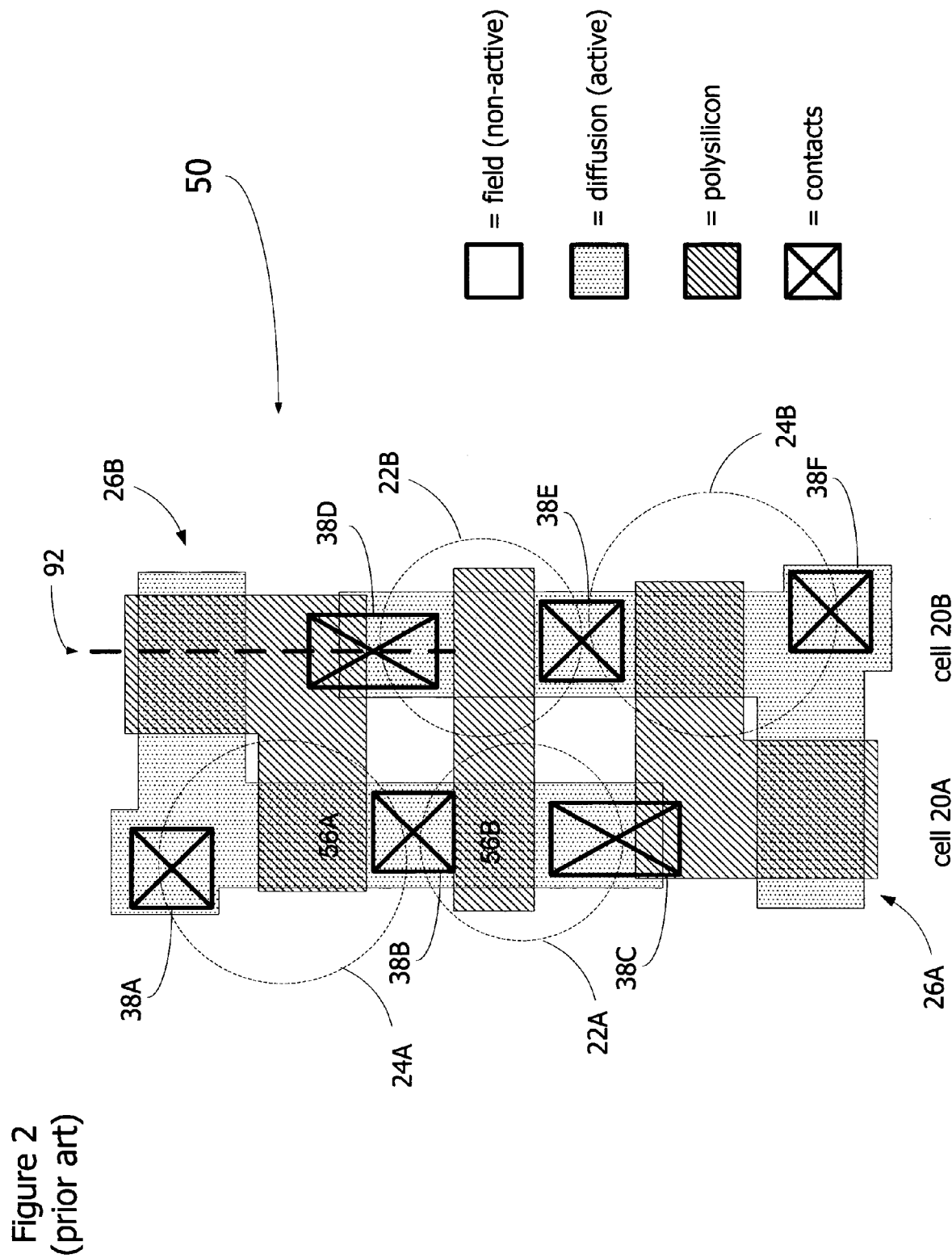
FIG. 2 is a layout diagram of the pair of 2T-1C gain cells of FIG. 1, according to the prior art.

Since size is a consideration in DRAM processing, the MOS capacitor is ideally positioned in an otherwise unutilized area of the semiconductor layout. In FIG. 2, for example, a layout diagram of the two-cell DRAM 50 of FIG. 1 is depicted, according to the prior art. The white region 52 is field (non-active region), the dotted areas represent diffusion 64 (active region), the hashed areas represent polysilicon 56, or poly, a conductor. (Diffusion 64 is a region of the semiconductor wafer in which dopants have been introduced. Polysilicon is silicon in which the Si atoms are arranged at random, cf. crystallized silicon.) (Gate oxide, not depicted in the layout 50 of FIG. 2, is automatically formed in the locations in which polysilicon 46 remains deposited over the diffusion 64.) As in FIG. 1, the layout shows two mirrored cells 20A and 20B.

Contacts 38A, 38B, 38C, 38D, 38E, and 38F (collectively, contacts 38) are used to interconnect the transistors and capacitors in the DRAM 50. The contacts 38 are marked by Xs. Two of the contacts (38B and 38E) are known as self-aligned contacts (SAC) and two of the contacts (38C and 38D) are shared contacts, as explained below. Regions in which polysilicon 34 crosses diffusion 36 form either the channel region of a transistor or part of a MOS capacitor. In FIG. 2, read transistor 24A, write transistor 22A, read transistor 24B, and write transistor 22B are generally indicated (circled), as are MOS capacitors 26A and 26B.

The contact 38A occupies a region of the diffusion 36 orthogonal to a region in which no transistor element is present, as does the contact 38F. The regions orthogonal to the contacts 38A and 38F would otherwise be "wasted" real estate, since the diffusion and polysilicon regions are used for the four transistors. Thus, the MOS capacitors 26B and 26A are positioned orthogonal to the contacts 38A and 38F, respectively, in an otherwise unutilized area, for efficient use of space. The MOS capacitor 26A is parallel to the read transistor 24B; the MOS capacitor 26B is parallel to the read transistor 24A, consistent with the circuit diagram of FIG. 1.

Typically, all contacts are drawn with the same size across the layout. The contacts are quite small (as small as transistor gates), and may present challenges during processing, relative to other processing steps. By drawing contacts in a uniform manner, the process may be simplified. Contacts typically make connections between a metal layer and the diffusion, or between the metal layer and the polysilicon, but not between the diffusion and the polysilicon.

Recently, there have been some changes to contact processing, however. Shared, or "elongated," contacts have been used as a local interconnect between the polysilicon and the diffusion. Elongated contacts 38C and 38D of FIG. 2 are examples of shared contacts. Shared contacts add to the complexity of semiconductor processing, but the added complexity is understood in current logic processing. Further, since connections between transistors gates (polysilicon) are often made to the source or drain of other transistors (diffusion), the use of shared contacts may be well worth the additional processing, in some environments.

Self-aligned contacts (SACs) are also featured in FIG. 2. Like shared contacts, SACs enable the transistor elements to be spaced closely together, without fear of unwanted shorting between regions. Contacts 38B and 38E are SACs. The special processing of the SAC 38B ensures that shorting between the polysilicon regions 56A and 56B are avoided. Without the special processing used to make SACs, the contacts would be spaced apart from adjacent regions, as with contacts 38A and 38F.

The process in which transistors are formed is known as the front-end processing of the semiconductor. This process may include one or more of the following steps: wafer surface preparation, patterning and implantation of dopants, growth or deposition of dielectric material and insulating material; the steps may utilize many techniques, such as photolithography, etching, diffusion, ion implantation, deposition, and chemical mechanical planarization, to name a few methods used during front-end processing. Along with the transistors, the MOS capacitors of FIG. 2 are created during this front-end processing.

Figure 3:
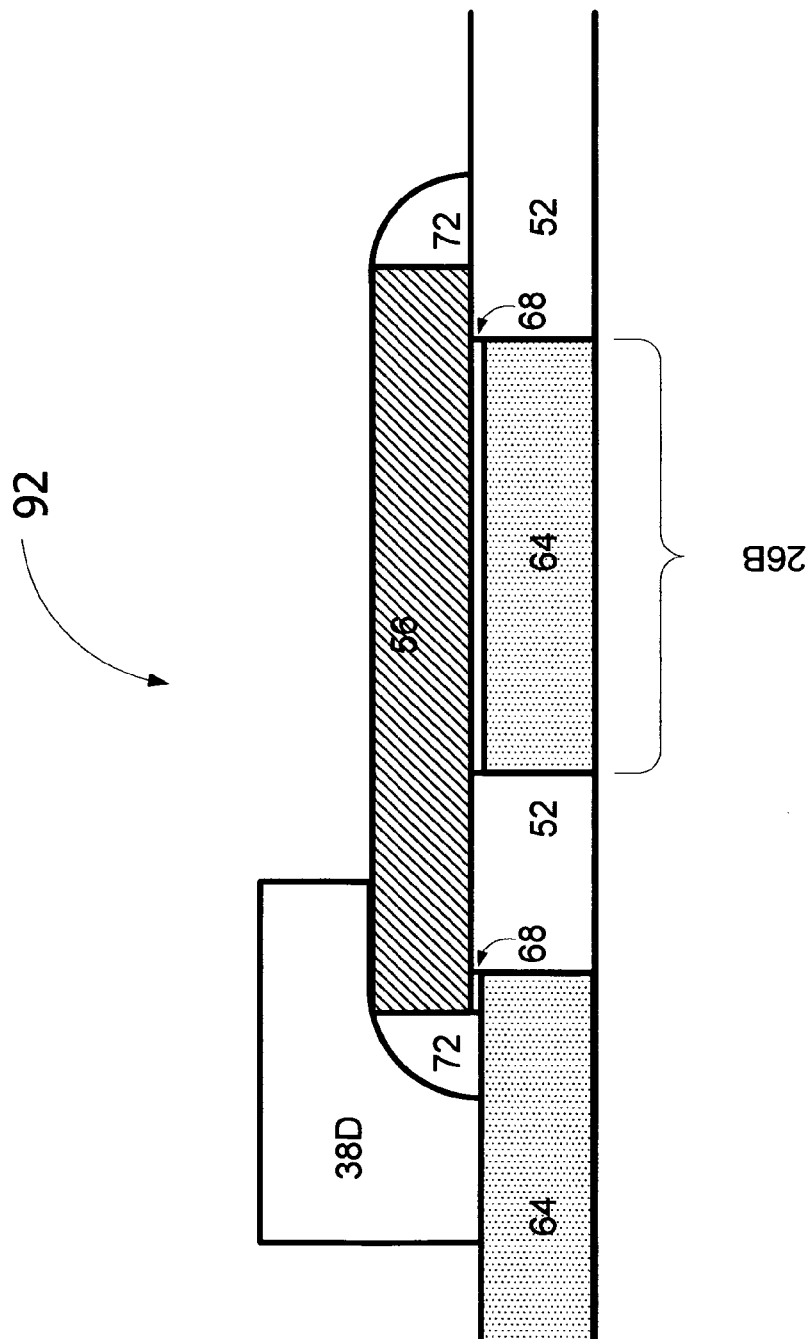
FIG. 3 is a cross-section of the layout diagram of FIG. 2, according to the prior art.

FIG. 3 is a cross-section 92 of the layout 50 (see vertical dotted line in FIG. 2) showing the MOS capacitor 26B, according to the prior art. The layers of the cross-section 92 may be viewed from the bottom of FIG. 3, moving in an upward direction. At the bottom layer are field 52 and diffusion 64. A layer of polysilicon 56 is deposited, then etched according to a mask. Gate oxide 68, which forms during the semiconductor processing, remains between the diffusion 64 and the polysilicon 56, as shown in FIG. 3. Spacers 72, which made using non-conductive materials, such as nitride/oxide mixtures, are formed along the edges of the polysilicon 56. The elongated contact 38D, which is likely tungsten (W), is disposed over the polysilicon 56. The elongated contact 38D is formed at the same time as other contacts on the layout, using a special process known to those of ordinary skill in the art of semiconductor processing. The MOS capacitor 26B is thus formed from three layers: diffusion 64, gate oxide 68, and polysilicon 56.

The MOS capacitor 26B of FIGS. 2 and 3 is thus formed using many of the same techniques used to form transistors, with the exception of the special processing of the elongated contact 38D. In this regard, the MOS capacitor is a good candidate for a process in which DRAMs, such as the 2T-1C gain cells of FIG. 1, are integrated with other logic circuits.

When the 2T-1C DRAM 50 is scaled, however, the gate oxide is thinned and gate leakage becomes the dominant limiter of retention. This is because the gate length of the write transistor may be increased to reduce subthreshold leakage as a factor. With thin oxide, the efficacy of the MOS capacitor 26A (26B) is reduced; even though the MOS capacitor adds capacitance proportional to its area, the capacitor also adds gate leakage proportional to its area, and thus provides no benefit. Another issue is that the MOS capacitor 26A (26B) has a voltage dependence; the capacitance of the MOS capacitor is different if the voltage across the capacitor is different (non-linear capacitor). This means that the capacitance will be different, depending on whether a "1" or a "0" value is stored at the storage node 28A (28B). Thus, although the MOS capacitor 26A may improve the retention time of the cell 20A, the improvement will be lost once the DRAM is scaled.

According to some embodiments, a metal-insulator-metal (MIM) capacitor may be formed using typical front-end processing steps, providing great improvement in the performance of a DRAM such as the DRAM 50 of FIG. 2. Before discussing the processing steps for the improved MIM capacitor, however, a typical CMOS process is depicted, according to the prior art. Following that, the process of forming the MIM capacitor is described in FIG. 5.

Figure 4:
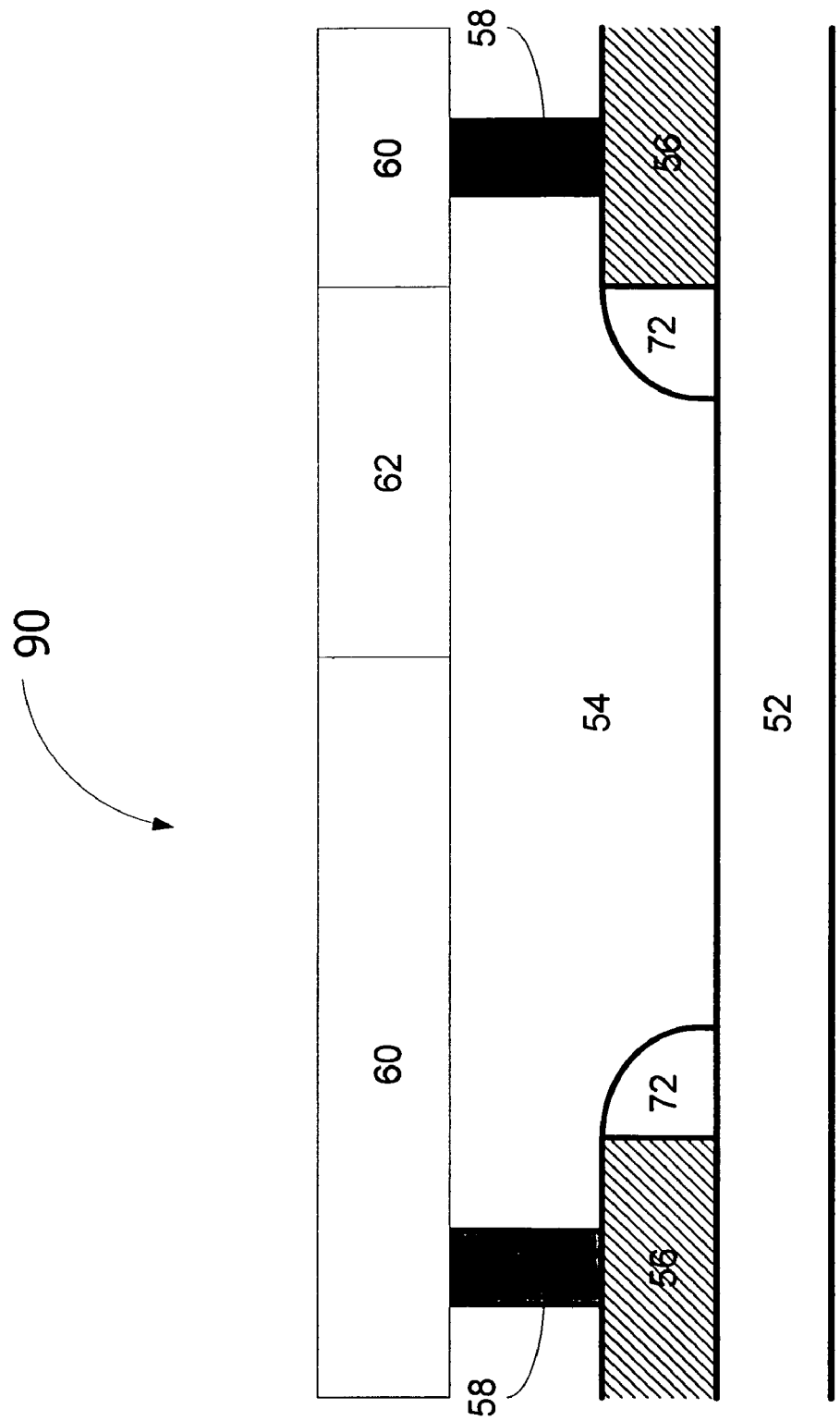
FIG. 4 is a cross-section of a typical CMOS front-end processing, according to the prior art.

FIG. 4 depicts a cross-section following a typical complementary MOS (CMOS) process, up to the metal 1 layer, according to the prior art. The layers of the cross-section 90 may be viewed from the bottom of FIG. 4, moving in an upward direction.

The first, or lowest, layer is field oxide 52, which is non-active. (Alternatively, the lowest layer may be diffusion, or active.) The next layer is the polysilicon 56, with spacers 72 along each edge of the polysilicon. The third layer is the contacts 58. The contacts 58 are formed by depositing a non-conducting material, such as silicon dioxide ($SiO_2$) 54, and following the $SiO_2$ layer with a mask. The mask step may involve photolithography or other techniques, as is known to those of skill in the art. The mask includes Xs or other indicators to denote where the contacts are to be formed. Holes are next bored into the $SiO_2$ 54 layer wherever indicated by the mask (see the contacts 38 in FIG. 2).

A layer of some metal, typically tungsten, is then deposited over the $SiO_2$ layer, causing the bored holes to be filled with the tungsten, thus forming the contacts 58. Although the contacts 58 are typically identical in size, they can be elongated (see contacts 38C and 38D of FIG. 2), with an increase in process complexity. The above description constitutes some of the front-end processing of a typical semiconductor process.

After the transistors are formed, the typical CMOS back-end process flow starts with a blanket deposition of dielectric, e.g., $SiO_2$. Using a specialized process (known as Damascene process), trenches are patterned, etched, and filled with metal, e.g., copper (Cu). Connections between the transistors are thus formed using the Damascene process. Thus, the typical CMOS processing for forming transistors is described, and the cross-section 90 of FIG. 4 is formed following such processing, according to the prior art.

Figure 5:
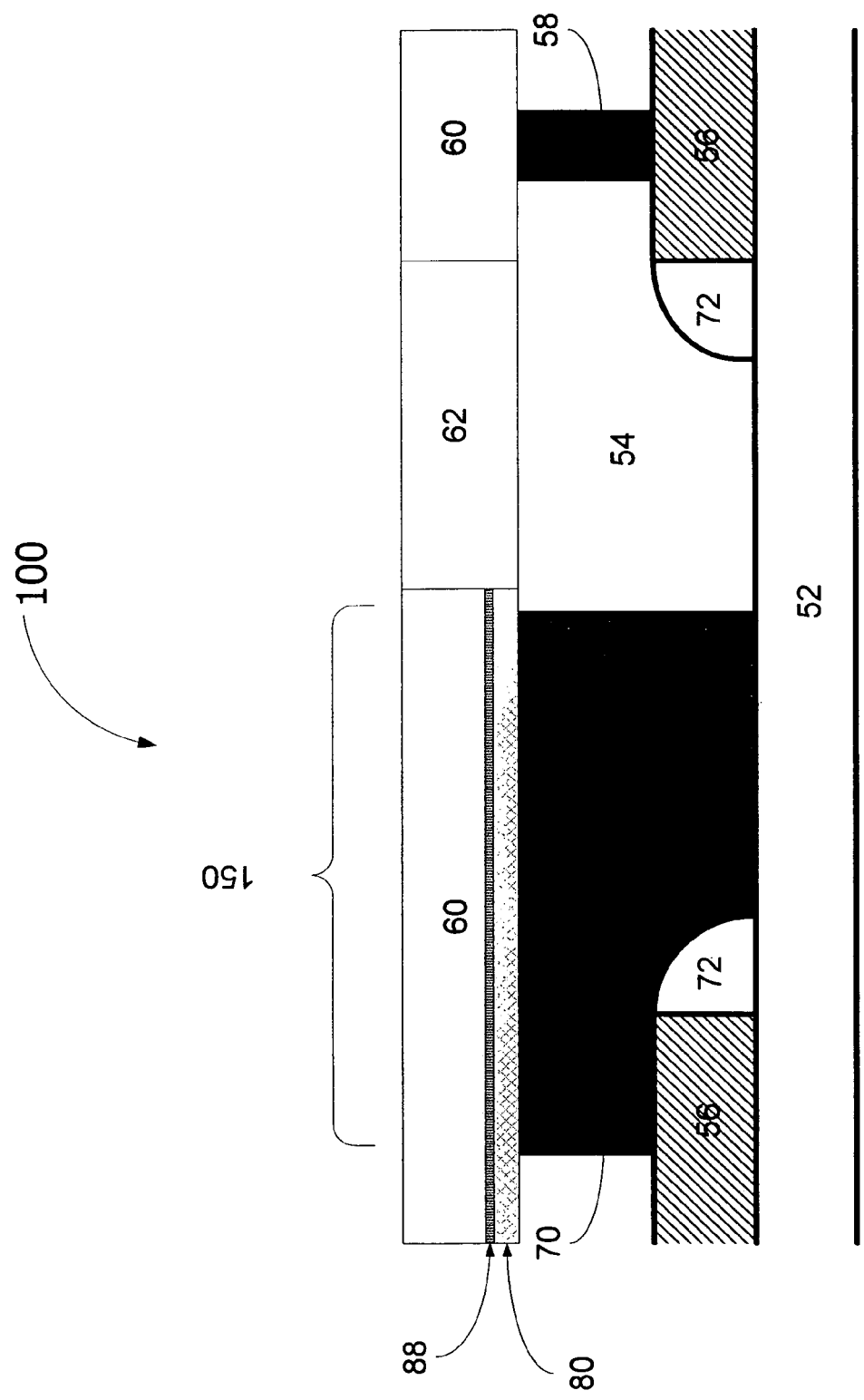
FIG. 5 is a cross-section of a metal-insulator-metal capacitor, according to some embodiments.
Figure 6:
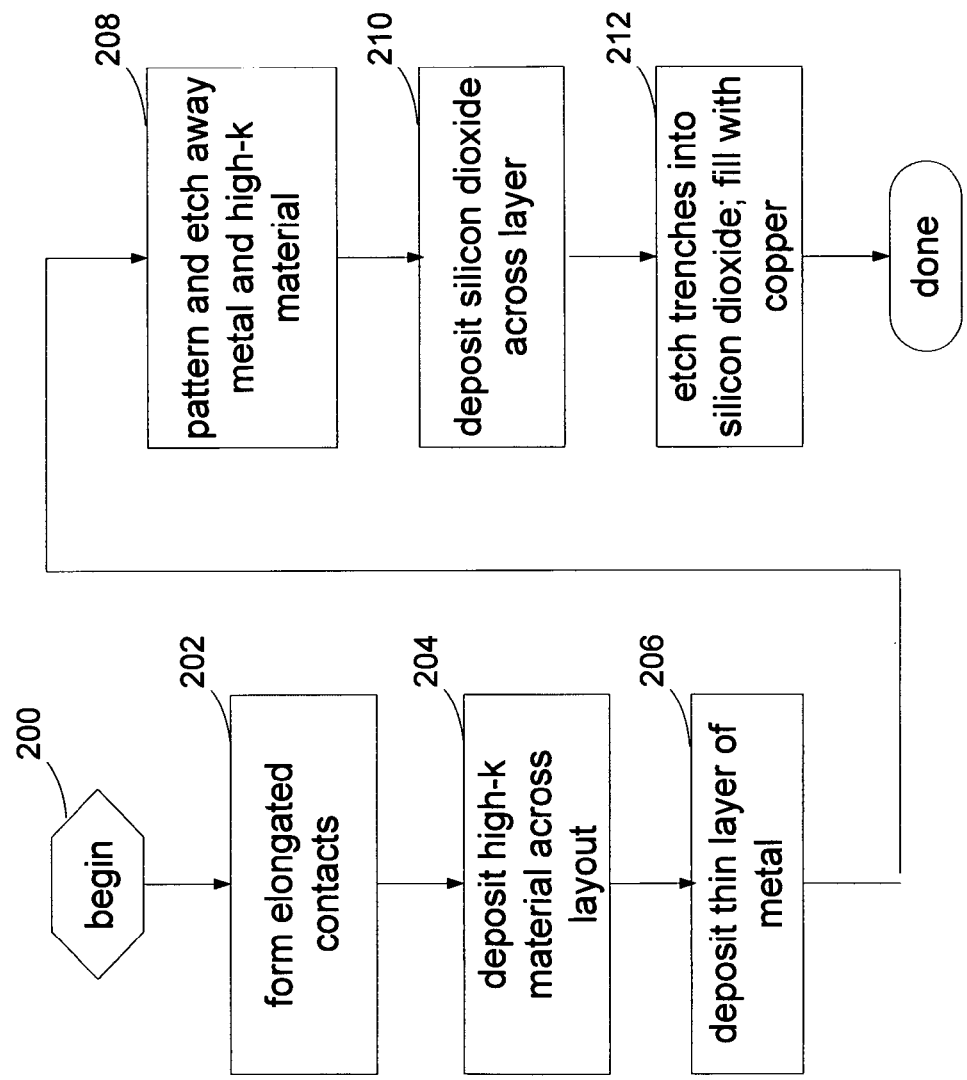
FIG. 6 is a flow diagram of the process steps for creating the metal-insulator-metal capacitor of FIG. 5, according to some embodiments.

In FIG. 5, an alternative layout of a capacitor formed in a CMOS process is disclosed, according to some embodiments. The capacitor to be formed is a metal-insulator-metal capacitor 150, which has several advantages over the previously described MOS capacitor. As will be shown, the MIM capacitor 150 is formed using process steps which are consistent with typical logic processing. FIG. 6 is a flow diagram detailing the process steps used to form the MIM capacitor 150 of FIG. 5. The process steps in FIG. 6 in the following description are denoted with the designation "block #" in parentheses. The process steps begin with the formation of elongated contacts; the prior steps for forming the MIM capacitor 150 conform to prior art logic processing.

Looking at the layout 100 from the bottom, a field 52 is shown. A layer of polysilicon 56 is deposited, then selectively removed, so as to remain on some portions of the field 52, as shown. An elongated contact 70, which may be arbitrarily long, is shown. The elongated contact 70 is formed (FIG. 6; block 202). The elongated contact may be formed using an enhanced process, such as the process used to form the prior art elongated contacts (38C and 38D) of FIG. 2. The elongated contact 70 is formed at the same time as the non-elongated contact 58. In some embodiments, the elongated contact 70 and the non-elongated contact 58 are made of tungsten material.

Following the formation of the elongated contact 70, a layer of high-k material 80 is deposited on the layout 100 (block 204). In some embodiments, the high-k material has a k value of twenty-five (25) to thirty (30). Materials such as tantalum penta-oxide ($TaO_5$) and hafnium dioxide ($HfO_2$) are known materials with k values in this range, but other materials may be used. The high-k material will be the middle (dielectric) layer of the MIM capacitor 150. Because of its high-k properties, the material 80 is not thick, relative to the polysilicon layer 56, in some embodiments.

Following the deposition of the high-k material, a layer of metal 88 is deposited on the layout 100 (block 206). The metal 88 is depicted as being much thinner than the high-k material 80; however, the thickness of each material depicted in FIG. 5 may vary in relation to the other materials. Factors such as cost, the processes employed, the composition of the materials, and other criteria familiar to those of ordinary skill in the art are generally considered when deciding the dimensions of a particular material. In some embodiments, the metal 88 is tungsten. Although the metal 88 will hereinafter be referred to as tungsten 88, other metals may be used.

Following the deposition of the tungsten 88, a photoresist mask is deposited, then the tungsten 88 and the high-k material 80 are together etched away so as to remain over the elongated contact 70 (block 208). There exist a number of techniques for performing the etch operation. In some embodiments, the high-k material 80 and the tungsten 88 are etched using a dry etch procedure, a chemical process. When the etching occurs over regions in which the high-k material 80 and the tungsten 88 are to be removed, such as over the contact 58 in FIG. 5, the etching removes both materials (as specified by the photoresist or other mask).

The tungsten 88 provides at least two benefits during processing. First, the tungsten 88 prevents contact between the photoresist and the high-k material 80. Photoresist is an organic material deposited on the layout 100 that acts like a film. When the photoresist is exposed to light, its chemical properties change. By selectively exposing the photoresist to light, it operates as a template or mask, enabling materials to be selectively removed from the layout. Exposing the high-k material 80 to the photoresist is undesirable, in some embodiments. Second, during the procedure in which trenches are formed into the $SiO_2$ (block 212), the tungsten 88 provides an indicator of where to stop the trenches.

Once the high-k material 80 and layer of tungsten 88 are deposited and etched so as to be disposed over the elongated contacts 70, a thick layer of silicon dioxide ($SiO_2$) 62 is deposited on the layout 100 (block 210). Trenches are etched into the $SiO_2$, wherever connections are to be made, then a layer of metal 60, usually copper, is added to fill in the trenches (block 212). A trench is formed atop the region where the elongated contact 70 is disposed, as well as atop the region where the contact 58 is positioned, allowing the metal 60 to fill the regions. Again, photoresist material may be used to mask the trench locations. When the etching occurs over the elongated contact 70, the rate of etch slows down as the tungsten 88 is reached. Thus, while some of the tungsten 88 deposited over the elongated contact 70 may be etched away, known as over-etch, the tungsten 88 is made thick enough to compensate for the occurrence. In a second embodiment, a spectroscopic technique is used, in which the chemical byproduct of etching the tungsten 88 is monitored during the etching process.

The result, as shown in FIG. 5, is to produce a metal-insulator-metal capacitor 150 comprising the metal 60 (with a layer of tungsten 88 beneath the metal 60), the high-k dielectric material 80, and the elongated contact 70. In some embodiments, the MIM capacitor 150 comprises copper (Cu), tantalum pentaoxide ($TaO_5$), and tungsten (W). In a second embodiment, the MIM capacitor 150 comprises copper (Cu), hafnium dioxide ($HfO_2$), and tungsten (W). The above thus describes a process for forming the MIM capacitor 150, according to some embodiments.

The process steps for forming the MIM capacitor 150 occur between the front-end processing and the back-end processing of the layout 100, after the contacts have been laid down, but before the first metal layer is formed, with the exception that the front-end processing may be modified to include provisions for elongated contacts.

Returning to FIG. 2, the MIM capacitor 150 (FIG. 5) and processing modification (FIG. 6) may be used to replace the MOS capacitors 26A and 26B in the DRAM 50, according to the following steps. The diffusion 64 beneath the polysilicon 65 at the MOS capacitor 26A (26B) may be removed so that the polysilicon is now over field oxide 52 rather than an active area (diffusion 64). The shared contact 38C (38D) may then be enlarged to cover the polysilicon 56 that used to form the MOS capacitor 26A (26B), subject to the minimum spacing rules between neighboring contacts. The layout of FIG. 2, which depicts the results of front-end processing of the layout 50, does not include further elements, such as the metal 1 layer.

Once the contacts are laid down, the high-k material 80 may be deposited over the layout 50; then a layer of metal 88, such as tungsten, may likewise be deposited over the layout 50. Both the high-k material 80 and the metal 88 are then selectively etched away, as described above. Following the etch procedure, the high-k dielectric 80 remains deposited over the elongated contact 38C (38D). A $SiO_2$ layer 62 is then deposited on the layout 50, then trenches are formed, as described above, and metal 1 60 is deposited, using the Damascene process (or another process), until the metal 1 fills the trenches. In this manner, a MIM capacitor 150, replacing the MOS capacitor 26A (26B), is formed between the elongated contact 38C (38D) and overlapping metal 1. The high-k material 80 and metal layer 88 are etched away over all other contacts (38A, 38B, 38E, and 38F), so that a normal connection will be made to overlapping metal 1.

By removing the active area underneath the MOS capacitor 26A (26B), gate oxide leakage in that area is reduced, since field oxide 52 is more than one hundred times thicker than gate oxide. In some embodiments, the MIM capacitor 150 (FIG. 5) formed between the elongated contact 70 and metal 1 60 will enhance the retention time of a DRAM cell using the MIM capacitor. Thus, the advantages of the 2T gain cell of FIG. 1 are extended to future technologies where gate leakage will cancel the benefit of the MOS capacitor. Also, since a high-k material is used, a larger capacitance per unit area may be obtained using the MIM capacitor 150, as compared to a MOS capacitor.

The mask step defines where the high-k dielectric 80 and tungsten 88 remain, allowing the MIM capacitor 150 to be formed between the elongated contact 70 and the overlapping metal 1 layer 60. The high-k dielectric 80 is etched away from all other regions of the layout 50, enabling normal connection between contacts (e.g., contact 58) and metal 1 60 occurs. However, in some embodiments, the mask is modified so that the deposit of the high-k material 80 and the tungsten 88 remain in locations along the layout which have neither elongated contact 70s nor regular-sized contacts 58 beneath the deposit. What this forms is a thin-film resistor. The thin film resistors may be formed simultaneously with the MIM capacitors described above.

Figure 7:
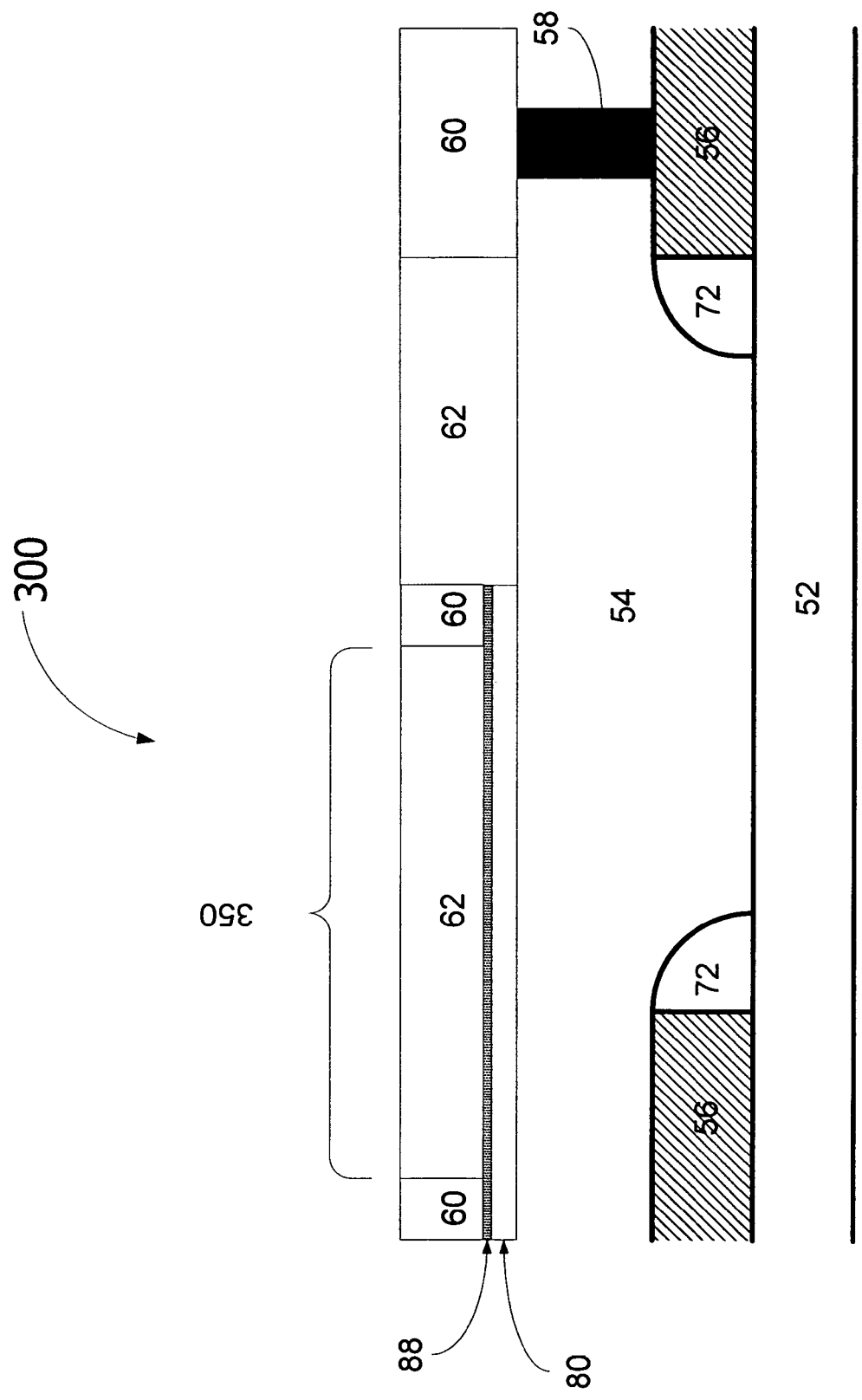
FIG. 7 is a cross-section of a thin-film resistor formed along with the metal-insulator-metal capacitor of FIG. 5, according to some embodiments.

In FIG. 7, a thin-film resistor 350 is depicted in a CMOS layout 300, according to some embodiments. Resistors, which are passive elements, are generally not formed close to the transistors in a process stack, because of issues with parasitics. There may be circumstances, however, in which a thin-film resistor 350 may be useful to a system design. The thin-film resistor 350 includes the high-k dielectric material 80 and the tungsten layer 88, with metal contacts 60 on either side allowing for connection to the metal layer. Instead of having trenches formed in the $SiO_2$ layer atop the entire tungsten layer 88, as in FIG. 5, the trenches are formed on left and right sides of the tungsten layer, allowing the metal 60 to be disposed atop the tungsten at either end, with $SiO_2$ remaining in the middle. As shown in FIG. 7, the thin-film resistor 350 is disposed over the $SiO_2$ layer 54 and is not formed over a contact.

Figure 8:
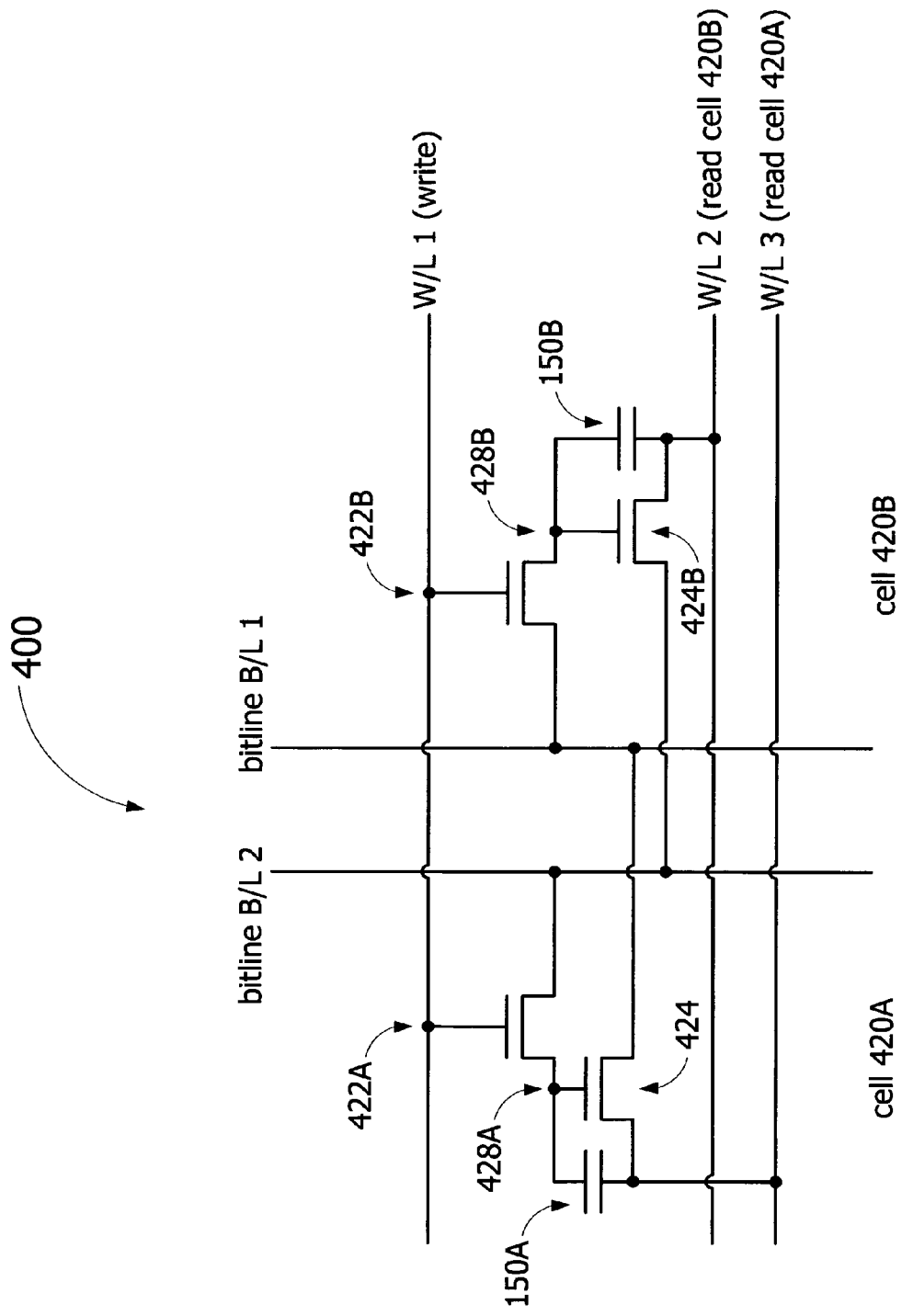
FIG. 8 is a schematic diagram of a pair of 2T-1C gain cells of a DRAM including metal-insulator-metal capacitors, according to some embodiments.

The MIM capacitor 150 of FIG. 5 may be part of a DRAM. In FIG. 8, for example, a schematic of a DRAM 400 includes a pair of gain cells 420A and 420B. Gain cell 420A includes write transistor 422A, read transistor 424A, and MIM capacitor 150A; gain cell 420B includes write transistor 422B, read transistor 424B, and MIM capacitor 150B. The cells 420A and 420B share two bit lines B/L 1 and B/L 2 and three word lines, a word line W/L 1 (write), a word line W/L 2 (read), and a word line W/L 3 (read). The MIM capacitors 150A and 150B boost the capacitance at the storage nodes 428A and 428B, to improve the retention time of the cells 420A and 420B.

The DRAM 400 of FIG. 8 may be integrated with normal logic processing, such as for building microprocessors. The DRAM 400 is preferred over SRAM, due to its smaller size. Using the DRAM 400, more cache memory may be integrated with a microprocessor than is available using SRAM. This improves processor performance efficiently, both in terms of area and power, which reduces cost.

The DRAM 400 is also preferred over the prior art DRAM 50 (using MOS capacitors). As described above, the prior art 2T-1C DRAM is too leaky, when scaled, for use in current microprocessor designs. The DRAM 400, however, can be implemented with little change to the standard CMOS process flow. In some embodiments, the MIM capacitor process allows very dense local interconnections without using or blocking the metal 1 layer. In addition to DRAM, the MIM capacitor 150 may be useful for many other technologies, such as analog circuits, radio frequency (RF) circuits, and more.

An additional benefit of the aforementioned process is that a local interconnect layer is made available, which is useful for connecting gates to diffusions, and vice-versa, without using or blocking metal 1. The capacitor between elongated contacts and metal 1 can also be used where large, linear capacitance is desired, such as in many analog and radio frequency (RF) circuits.

The MIM capacitor is a linear capacitor. This means that its capacitance does not depend on the voltage across the capacitor. The MOS capacitors described herein are non-linear, meaning that the capacitance is different, depending on whether a "1" or a "0" is stored in the memory cell. Particularly for memories, the MIM capacitor may be preferred.

While the invention has been described with respect to a limited number of embodiments, those skilled in the art will appreciate numerous modifications and variations therefrom. It is intended that the appended claims cover all such modifications and variations as fall within the true spirit and scope of the invention.

We claim:

1. A method, comprising:
   disposing an elongated contact on a semiconductor layout;
   depositing a material with a high dielectric constant on the semiconductor layout, the material disposed at least over the elongated contact;
   etching away the material from the semiconductor layout, wherein the material remains disposed at least over the elongated contact following the etch; and
   depositing a metal on the semiconductor layout, the metal being disposed at least over the elongated contact, wherein the elongated contact, material, and metal form a capacitor.

2. The method of claim 1, depositing a material with a high dielectric constant further comprising:
   depositing a material with a dielectric constant of at least twenty-five.

3. The method of claim 1, depositing a material with a high dielectric constant further comprising:
   depositing a tantalum pentaoxide material.

4. The method of claim 1, depositing a material with a high-dielectric constant further comprising:
   depositing a hafnium dioxide material.

5. The method of claim 1, further comprising:
   depositing a second metal on the material; and
   etching away the material and the second metal from the semiconductor layout, wherein the material and the second metal remain disposed at least over the elongated contact following the etch.

6. The method of claim 5, depositing a second metal on the material further comprising:
   depositing tungsten on the material.

7. The method of claim 5, further comprising:
   etching away the material and the second metal from the semiconductor layout, wherein a portion of the material and the metal remains disposed over a region with no elongated contact following the etch; and
   filling trenched regions of silicon dioxide deposited on the semiconductor layout with the metal such that the metal is disposed on a left side and on a right side of the portion; wherein the portion and the metal disposed on the left side and the right side of the portion form a resistor.

8. A semiconductor process, comprising:
   depositing contacts on a semiconductor wafer, wherein at least one contact is elongated and the elongated contact is disposed partially over a field oxide layer and partially over polysilicon layer;
   depositing a high-k material layer;
   etching the high-k material layer according to a mask so that a portion of the high-k material remain disposed at least over the elongated contact;
   etching trenches in a non-conducting material layer deposited on the semiconductor wafer and depositing a metal over the non-conducting material so that the metal fills the trenches;
   wherein the elongated contact, the portion of the high-k material, and the metal comprise a capacitor.

9. The semiconductor process of claim 8, further comprising:
   depositing a metal layer on the high-k material layer, wherein the metal layer is etched with the high-k material.

10. The semiconductor process of claim 8, further comprising:
    etching the high-k material layers according to the mask so that a second portion of the high-k material remains disposed over no contact; and
    etching a first trench and a second trench in the non-conducting material layer, wherein the first trench is disposed atop a left side of the second portion and the second trench is disposed atop a right side of the second portion, the second metal filling the first trench and the second trench; wherein the second portion of the metal and the high-k material and the second metal filling the first trench and the second trench form a resistor.

11. The semiconductor process of claim 8, etching trenches in a non-conducting material layer deposited on the semiconductor wafer further comprising:
    concluding the trench etch process once the metal layer is reached.

12. The semiconductor process of claim 11, depositing a high-k material layer further comprising:
    depositing a material with a dielectric constant of at least twenty-five.

* * * * *